(12) United States Patent
Chen et al.

(10) Patent No.: US 8,402,412 B1
(45) Date of Patent: Mar. 19, 2013

(54) INCREASING CIRCUIT SPEED AND REDUCING CIRCUIT LEAKAGE BY UTILIZING A LOCAL SURFACE TEMPERATURE EFFECT

(75) Inventors: Cinti X. Chen, San Jose, CA (US); Xiao-Yu Li, Palo Alto, CA (US); Joe W. Zhao, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 10 days.

(21) Appl. No.: 13/112,896

(22) Filed: May 20, 2011

(51) Int. Cl.
*G06F 17/50* (2006.01)
(52) U.S. Cl. .................................................. 716/118
(58) Field of Classification Search .................. 716/118
See application file for complete search history.

(56) References Cited

U.S. PATENT DOCUMENTS

| | | | |
|---|---|---|---|
| 7,310,759 B1 * | 12/2007 | Carmichael et al. | 714/725 |
| 2008/0203540 A1 * | 8/2008 | Anderson et al. | 257/629 |
| 2010/0019329 A1 * | 1/2010 | Poon et al. | 257/390 |
| 2011/0214101 A1 * | 9/2011 | Cheng et al. | 716/136 |
| 2012/0144361 A1 * | 6/2012 | Cheng et al. | 716/132 |

OTHER PUBLICATIONS

Ahsan, I. et al., "RTA-Driven Intra-Die Variations in Stage Delay, and Parametric Sensitivities for 65nm Technology," *2006 Symposium on VLSI Technology Digest of Technical Papers*, Jun. 13, 2006, pp. 1-2, IEEE, Piscataway, New Jersey, USA.

SEMI, "New Activation anneals help dopants stay put," *Semiconductor Manufacturing Magazine*, Aug. 2005, pp. 1-7, Semiconductor Equipment and Materials International (SEMI), San Jose, California, USA.

* cited by examiner

*Primary Examiner* — Suresh Memula
(74) *Attorney, Agent, or Firm* — W. Eric Webostad; LeRoy D. Maunu

(57) ABSTRACT

An embodiment of an integrated circuit is disclosed. For this embodiment, the integrated circuit includes circuit blocks. At least one transistor of a circuit block of the circuit blocks includes a portion of a semiconductor substrate having a diffusion layer. The circuit block has a relatively high diffusion pattern density as compared with others of the circuit blocks. The diffusion layer has an exposed surface active area constrained responsive to a design rule. The design rule is to limit to a maximum amount the surface active area in order to improve at least one parameter of the at least one transistor selected from a group consisting of an increase in switching speed and a decrease in leakage current of the at least one transistor of the circuit block having the relatively high diffusion pattern density.

16 Claims, 8 Drawing Sheets

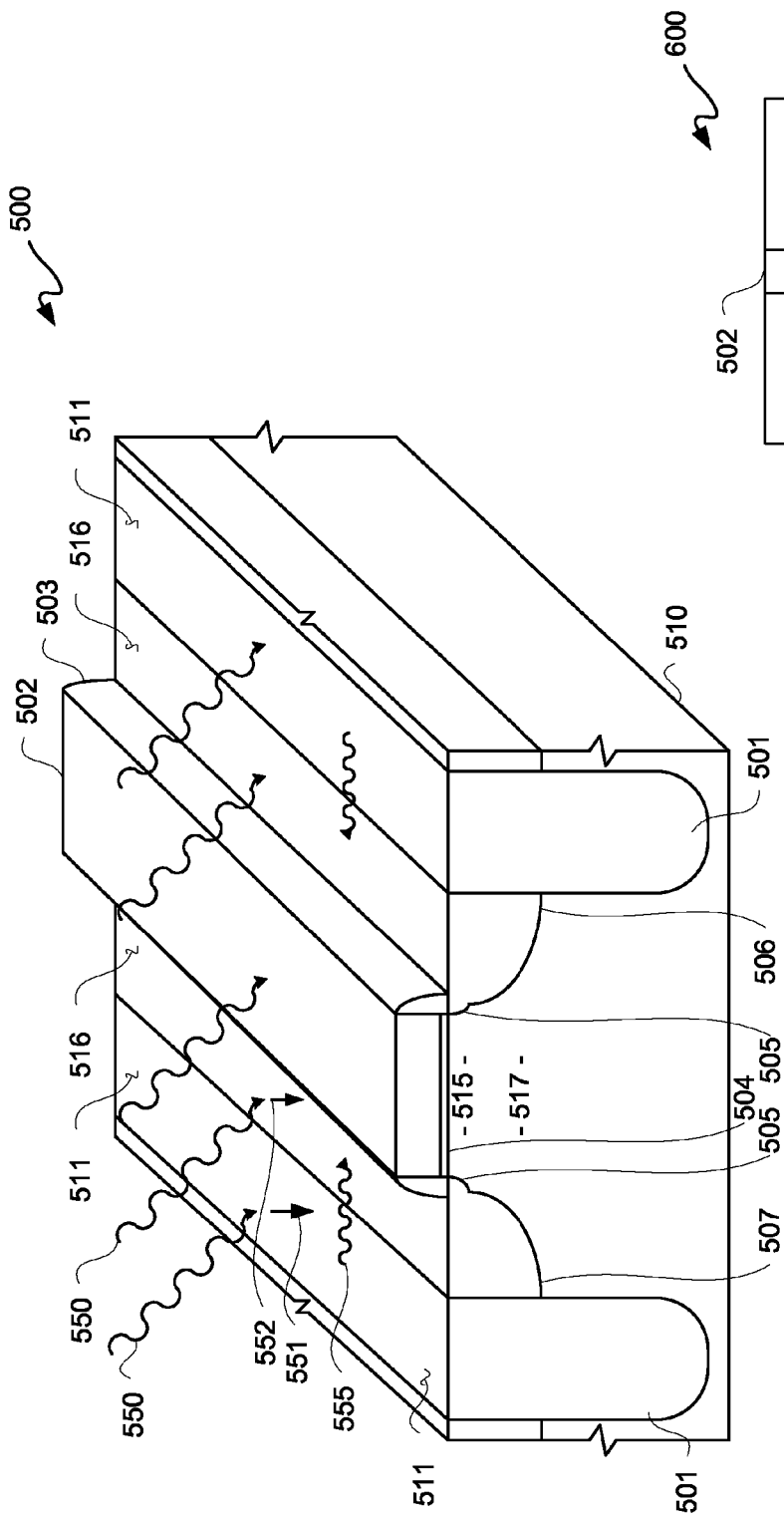
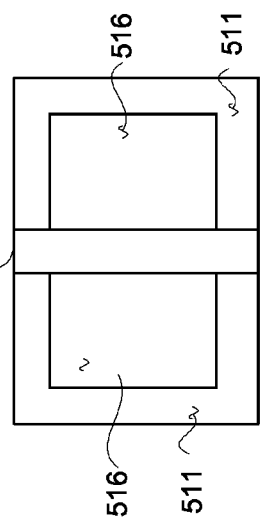
FIG. 5
FIG. 6

INCREASING CIRCUIT SPEED AND REDUCING CIRCUIT LEAKAGE BY UTILIZING A LOCAL SURFACE TEMPERATURE EFFECT

FIELD OF THE INVENTION

An embodiment of the invention relates to integrated circuit devices ("ICs"). More particularly, an embodiment of the invention relates to manufacturing an IC for increased circuit speed and reduced circuit leakage by utilizing a local surface temperature effect.

BACKGROUND

Performance and/or leakage current among circuit blocks of an IC may vary. Thus, same circuit blocks of an IC may perform differently. Such variation may be due to differences during semiconductor processes used to manufacture such an IC. Accordingly, it would be desirable and useful to account for some of this variation.

SUMMARY

One or more embodiments generally relate to manufacturing an integrated circuit for increased circuit speed and reduced circuit leakage by utilizing a local surface temperature effect.

An embodiment relates generally to an integrated circuit. In such an embodiment, the IC includes circuit blocks. At least one transistor of a circuit block of the circuit blocks includes a portion of a semiconductor substrate having a diffusion layer. The circuit block has a relatively high diffusion pattern density as compared with others of the circuit blocks. The diffusion layer has an exposed surface active area constrained responsive to a design rule. The design rule is to limit to a maximum amount the surface active area in order to improve at least one parameter of the at least one transistor selected from a group consisting of an increase in switching speed and a decrease in leakage current of the at least one transistor of the circuit block having the relatively high diffusion pattern density.

Another embodiment relates generally to a method for floor planning an integrated circuit. In such an embodiment, a first block with a first active area is placed. A second block with a second active area is placed proximate to the first block. The first active area is substantially larger than the second active area. The second block is placed to provide thermal conduction to at least one region of the first block associated with the first active area to increase a temperature thereof during a semiconductor process in order to enhance activation of dopants in the at least one region of the first block.

Another embodiment relates generally to a method for reducing performance variation among circuit blocks of an IC. In such an embodiment, obtained is a first surface temperature value associated with a first surface area of a first circuit block of the circuit blocks, and obtained is a second surface temperature value associated with a second surface area of a second circuit block of the circuit blocks. For the first surface temperature value of the first circuit block being significantly less than the second surface temperature value of the second circuit block, first gate lengths of first transistors of the first circuit block of the IC are designed to be shorter than second gate lengths of second transistors of the second circuit block, to compensate for differences in performance between the first transistors and the second transistors responsive to the first surface temperature value being significantly less than the second surface temperature value.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

FIG. 5 is a perspective view depicting an exemplary embodiment of an IC portion, such as a portion of an IC from the semiconductor wafer depicted in FIG. 3.

FIG. 6 is a top elevation view depicting an exemplary embodiment of a transistor, such as including the IC portion of FIG. 5.

DETAILED DESCRIPTION

Figure 1:
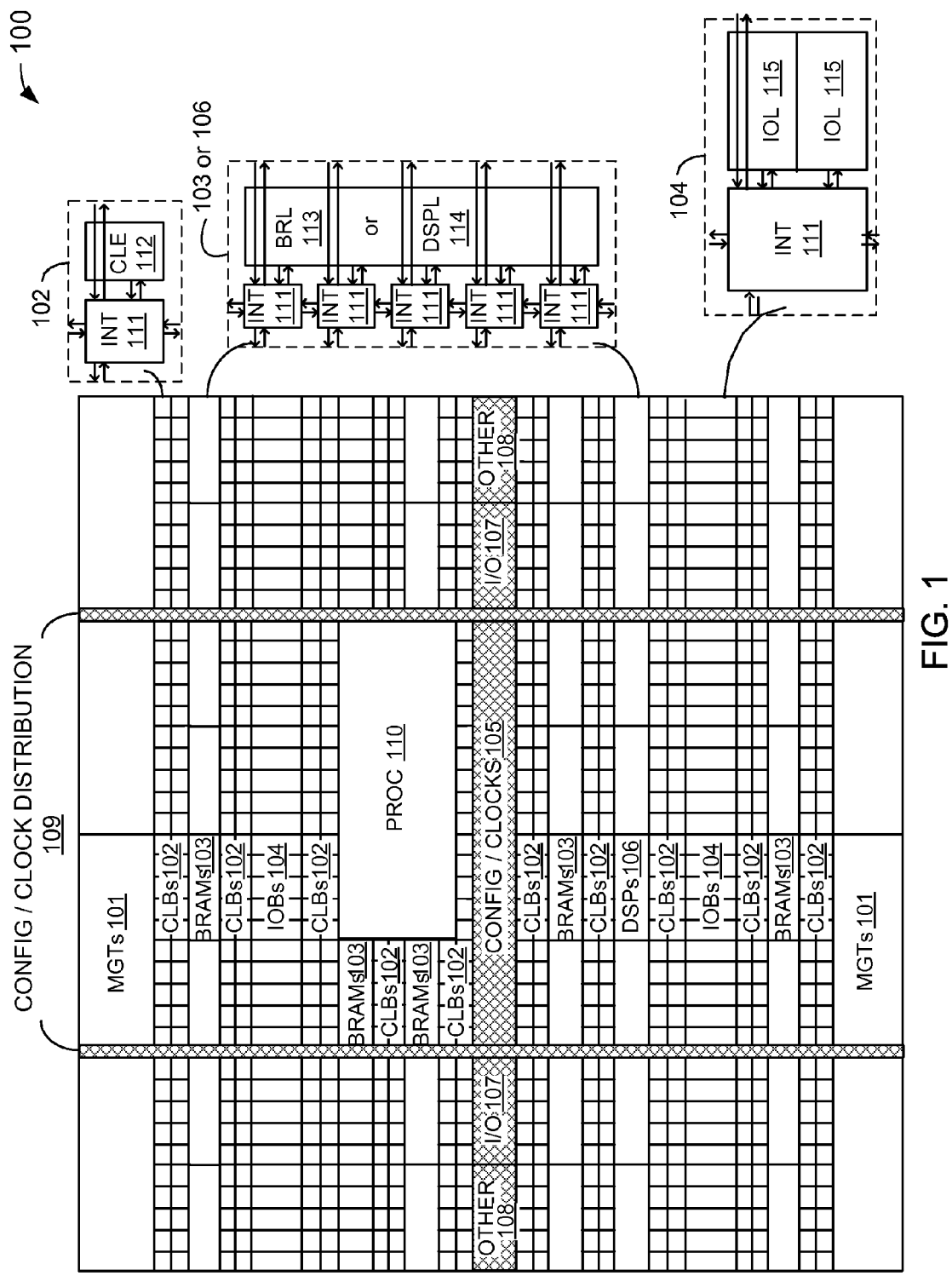
FIG. 1 is a simplified block diagram depicting an exemplary embodiment of a columnar Field Programmable Gate Array ("FPGA") architecture in which one or more aspects of the invention may be implemented.

In the following description, numerous specific details are set forth to provide a more thorough description of the exemplary embodiments. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Before describing exemplary embodiments illustratively depicted in the several figures, a general introduction is provided to further understanding. It has been determined that surface temperatures of semiconductor dice may vary from die-to-die, circuit block-to-circuit block, and transistor-to-transistor. Generally differences in surface temperatures during thermal cycling may lead to differences in diffusion of semiconductor impurities ("dopants"), and thus differences in performance of circuits.

Semiconductor dopants play a significant role in proper operation of semiconductor circuits. It should be understood that dopants, such as boron, arsenic, and/or phosphorous for example, are added to silicon to generally create localized regions of high concentrations of free carriers. These "impurities" in the silicon can be activated at higher temperatures and become mobilized carriers for driving electric current flow when proper voltages are applied to the IC. Therefore, the precise control of the concentration and initial placement of such dopants, as well as the activation of the dopants, is significant. More particularly, as devices, including transistors and the interconnections between them, become smaller, control of quantity and activation of the dopants has increased in significance with respect to circuit operation.

Dopants generally only become mobile when they are activated, namely in sites in a crystal lattice of a semiconductor such as silicon. After dopants are implanted into silicon, they are activated by exposure to high temperatures, such as by a thermal or laser anneal for example. With smaller dimensions, dopant concentrations may approach solid solubility limits, and thus the number of available lattice site vacancies per dopant ion may be reduced. Accordingly, more thermal energy may be used to ensure a more complete activation.

Thermal energy used for activation enhances diffusion, as diffusion rates may increase with temperature. It should be borne in mind that unlike activation, which occurs relatively quickly once a threshold energy level has been reached, diffusion is much more a product physical movement of atoms over relatively long distances which involves having a sufficiently high temperature for a sufficient period of time. To provide for activation while limiting diffusion, furnace annealing has generally been replaced with rapid thermal annealing ("RTA"). In RTA, thermal spikes last for less than a second. More recently, flash annealing has been used to limit thermal spikes to a millisecond range. However, achieving a uniform temperature with a very short thermal pulse, generally from halogen lamps, arc lamps, or other heat source, is made more problematic by variations in circuit pattern, as described below in additional detail.

This variation has been determined to be caused at least in significant part from differences in surface thermal reflectivity. For example, during a thermal cycle, such as provided by source/drain activation annealing, active area and field region surfaces are exposed to radiant heat. However, field region surfaces are more thermally absorbent than active area surfaces. Stated another way, active area surfaces are more thermally reflective than field region surfaces. For example, silicon is more thermally reflective than silicon oxide, and thus source/drain regions may not get as hot as isolation regions during a thermal cycle. Furthermore, it has been determined that there are proximity effects due to thermal conduction in a substrate. For example, a shallow trench isolation ("STI") area composed of an oxide layer has a significantly lower thermal reflectivity than an active diffusion area composed of silicon or doped silicon. So, for example, an active area with more STI area proximate thereto may receive more thermal energy by in-wafer conduction than an active area with less STI area proximate thereto. Additionally, for example, a circuit block that has a relatively high diffusion pattern density, and thus a relatively low surface temperature, may benefit by being placed proximate to one or more other circuit blocks or dummy tiles with a relatively low diffusion pattern density, and thus a relatively high surface temperature.

With the above general understanding borne in mind, various embodiments for increased circuit speed and reduced circuit leakage by improving diffusion pattern density of an IC are generally described below. For example, manufacturing an IC for increased circuit speed and/or reduced circuit leakage by utilizing a local surface temperature effect, such as by compensating for a surface temperature difference induced by various localized diffusion pattern densities or by adjusting transistor "hotness" based on a localized surface temperature effect, is described. In an embodiment, a design rule is established to limit the maximum amount of surface active area allowed in an IC design, so as to effectively limit how "cool" a device may be in order to ensure sufficient diffusion for activation and thus improved circuit performance and/or reduced circuit leakage. An example parameter for performance may be switching speed or delay of a transistor. By "leakage" or "leakage current," it is generally meant leakage current of a device. In such an embodiment, at least one transistor of a circuit block of circuit blocks of an IC includes a portion of a semiconductor substrate having a diffusion layer. The diffusion layer has an exposed surface active area constrained at least in part responsive to a design rule. Such design rules for diffusion layers may limit maximum surface active area on the IC in order to increase performance and/or reduce leakage of circuitry by increasing surface temperature of circuit blocks with relatively high diffusion pattern densities which otherwise may suffer as a result of lower surface temperature. Thus, such a design rule may constrain surface active area of such at least one transistor by imposing a maximum and/or minimum width and/or length for such surface active area. Such at least one transistor may be in a "critical path" with respect to circuit speed and/or leakage of an IC device.

Additionally, gate lengths of transistors, such as in a speed limiting or "critical" path of performance and leakage in slower or slowest circuit blocks, can be shortened in order to compensate a lower surface temperature effect as a result of neighboring blocks with high diffusion pattern density. A floor plan of an IC design can also be taken into consideration with respect to surface temperature effects as a result of different diffusion pattern densities. For example, blocks with large diffusion patterns, and thus slower Tilo (time loop delay) times, may be placed next to blocks without or with a significantly less degree of this issue. It should be understood that silicon or a doped silicon surface reflects heat during semiconductor processing, such as during RTA for example, and thus such surface has a lower surface temperature than less thermally reflective surfaces, such as oxide surfaces for example. Such thermal reflectivity may result in "colder" transistors, slower switching speeds, longer Tilo delay times, and/or worse circuit performance. In contrast, field oxide or other dielectric materials, which are not covered by a thermally reflective silicon surface, may have significantly more thermal absorptions. Such thermal absorption may result in "hotter" transistors, faster switching speeds, shorter Tilo delay times, and/or better circuit performance.

Accordingly, in another embodiment, floor planning of an IC is used so as to have one or more "hot" circuit blocks proximal to a "cool" circuit block. It should be understood that even with circuit blocks of identical circuit design, depending on diffusion pattern density of neighboring blocks thereto, a "cool" circuit block, namely one with a slower circuit speed, is likely the one next to a circuit block with a relatively high diffusion pattern density, and a "hot" circuit block, namely one with a faster circuit speed, is likely the one next to a circuit block with a relatively low diffusion pattern density. Another embodiment relates generally to floor planning an IC taking into account a surface temperature effect caused by high thermal reflectivity of diffusion surface area. In such embodiment, a first block with a first active area is placed. A second block with a second active area is placed proximate to the first block. The first active area is substantially larger than the second active area. The second block is placed to provide more thermal conduction of heat to at least one region of the first block associated with the first active area to increase temperature of the at least one region, including without limitation its surface temperature, during a semiconductor process in order to enhance activation of dopants in at least one region of the first block.

In another embodiment or in addition to the floor planning embodiment, one or more dummy tiles with relatively low thermal reflectivity may be placed in a location with a relatively large amount of thermally reflective surface area. By adjusting sizes and spaces between dummy tiles, thermal reflectivity can be manipulated to compensate for relative "hotness" or "coolness" of transistors in neighboring circuit blocks. In yet another embodiment, a "cool" circuit block has its gate lengths shortened to compensate for its transistors having less source/drain diffusion than a "hot" circuit block. Such an embodiment relates generally to reducing performance variation among circuit blocks of an IC. In such an embodiment, obtained is a first surface temperature value associated with a first surface area on the IC for a first circuit block, and obtained is a second surface temperature value associated with a second surface area on the IC for a second circuit block. For the first surface temperature value of the first circuit block being significantly less than the second surface temperature value of the second circuit block, gate lengths of transistors of the first circuit block, such as those which are performance limiters of the first circuit and/or in a critical path thus limiting performance of the IC, are designed to be shorter than the gate lengths of transistors of the second circuit block.

Because one or more of the above-described embodiments are exemplified using with a particular type of IC, a detailed description of such an IC is provided below. However, it should be understood that any IC having differences in surface temperature during a thermal cycle of a semiconductor manufacturing process due to differences in surface thermal reflectivity may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
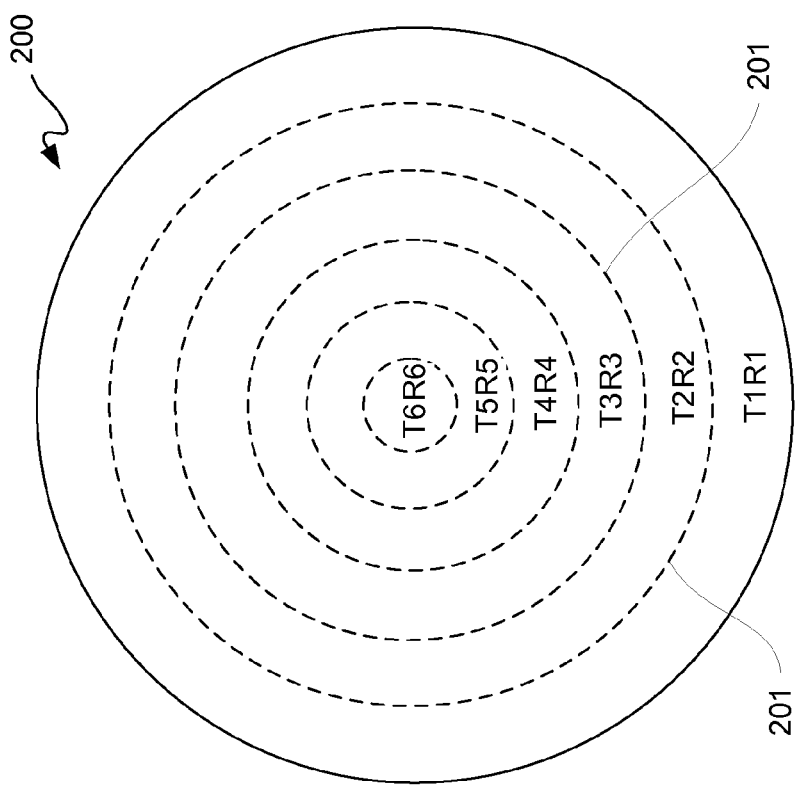
FIG. 2 is a top elevation view depicting an exemplary embodiment of a semiconductor wafer.

FIG. 2 is a top elevation view depicting an exemplary embodiment of a semiconductor wafer ("wafer") 200. Wafer 200 may be processed using a semiconductor process flow. Such a semiconductor process flow may include one or more recipes for various process operations. Each of these process operations may include one or more thermal cycles. For purposes of clarity by way of example not limitation, it shall be assumed that an anneal operation is used to provide at least one thermal cycle. More particularly, it shall be assumed that such an anneal operation is a rapid thermal anneal operation ("RTA"). However, it should be understood that in other embodiments, a flash anneal, laser anneal, or other anneal using a relatively short duration thermal spike for dopant activation may be used. It should be understood that an RTA may involve temperatures sufficiently high for diffusion of impurities or dopants in a semiconductor substrate for purposes of activation. However, it should be understood that other types of anneals, or more generally process operations having one or more thermal cycles sufficiently hot to promote such diffusion, may be used. For example, a thermal oxidation performed after an implantation or other form of dopant inclusion may involve a thermal cycle sufficiently high for diffusion of dopants for purposes of activation.

Concentric circles 201, as indicated with dashed lines, generally indicate thermal boundaries. It should be understood that in an RTA chamber, there may be multiple heat sources. These heat sources, even though positioned to provide generally uniform heating across the surface of wafer 200, may actually have some temperature variance or gradient across such surface of wafer 200. In this exemplary embodiment, there are six thermal zones referenced as T1 through T6; however, in other embodiments fewer or more than six thermal zones may be present. In each of thermal zones T1 through T6, one or more resistors may be formed. Such one or more resistors are generally referenced as R1 through R6 respectively referenced to thermal zones T1 through T6. Resistances of resistors R1 through R6 may be used to determine temperatures T1 through T6, respectively. Thus for purposes of calibrating or setting up an RTA chamber, resistances of R1 through R6 may be used to adjust heat sources of such RTA chamber in order to provide a more uniform heating across the surface of wafer 200.

Figure 3:
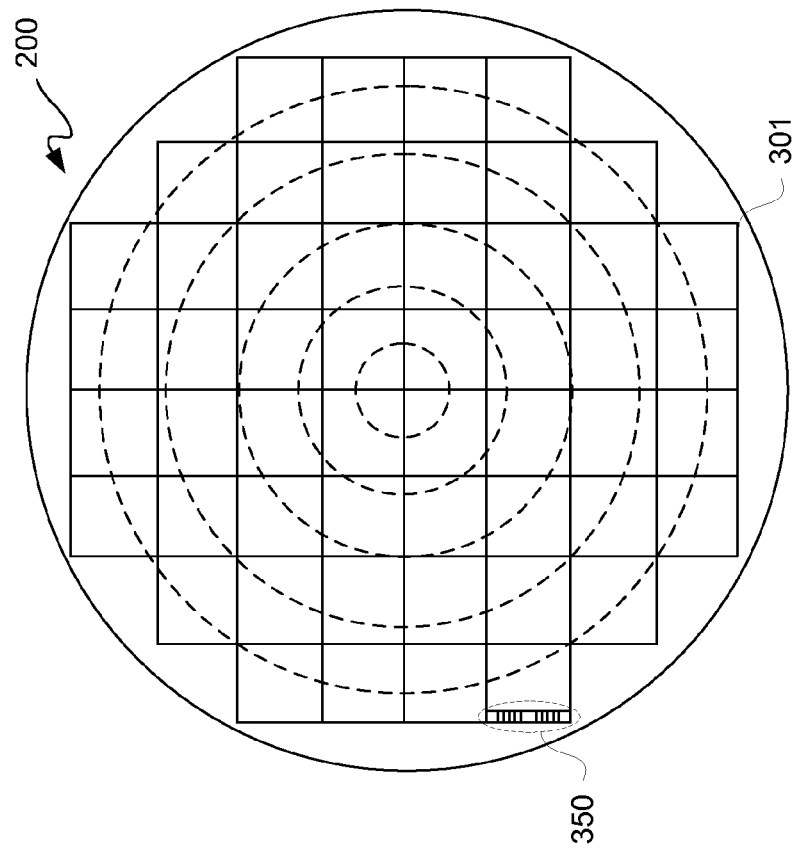
FIG. 3 is a top elevation view depicting an exemplary embodiment of the semiconductor wafer of FIG. 2 having semiconductor dice.

FIG. 3 is a top elevation view depicting an exemplary embodiment of wafer 200 of FIG. 2 having semiconductor dice ("dice" or "die"). A portion of a die, a die, or multiple die may be associated with a reticle field of reticle fields 301. Reticle fields 301 may be of a lithographic stepper or scanner. It should be appreciated that each die or portion thereof in a reticle field 301 may have multiple blocks or tiles 350. Such blocks or tiles 350 may be functional circuit blocks, scribe line blocks ("scribe areas"), or dummy tiles for example. For purposes of clarity by way of example and not limitation, FPGA circuit blocks are described below; however, these or other types of functional circuit blocks may be used.

Dice associated with reticle fields 301 may be located in one or more thermal zones, such as for example thermal zones T1 through T6, which may vary depending on die size and location on wafer 200. It should be understood that the squares used to depict reticle fields 301 should not be construed as limiting, nor should the particular pattern of reticle fields 301 be construed as limiting, as reticle fields may be any of a variety of shapes, layout patterns, and/or sizes.

Within an RTA chamber, it should be understood that dice of a wafer 200 may have waves of heat from one or more heat sources radiated toward an exposed surface, such as an upper surface of wafer 200. The angle of incidence of such waves of heat may vary with respect to position of a die of dice of wafer 200 relative to one or more heat sources of an RTA chamber.

As described below in additional detail, performance of a semiconductor die may be enhanced by improving, including without limitation optimizing, diffusion pattern density, and/or in-die variation may be reduced by improving, including without limitation optimizing, diffusion pattern density. Diffusion density may be proportional to surface temperature of a die of wafer 200, and higher diffusion pattern density may cause lower surface temperature. Generally, performance or speed of a die may be characterized by speed of certain selected circuits formed as part of such die. For purposes of clarity by way of example and not limitation, it shall be assumed that speed of a die is characterized using time-loop delay ("Tilo"). Generally, smaller Tilo values means less delay, and less delay generally means better performance. Thus, for example, a type of circuit in a die having a relatively high diffusion pattern density may have a Tilo value that is approximately 6% higher than a median value for Tilos of other identical within such a die. Conversely, circuits or other die areas, such as die seal and scribe areas, having relatively low diffusion pattern density may have Tilo values that are less than the median value for Tilos of other identical circuits within such die. For purposes of clarity by way of example and not limitation, by diffusion pattern density, it shall generally be meant as the relative amount of silicon surface area in a block or location that is doped silicon area. Thus, a high diffusion pattern density means that there is a substantial amount of active silicon area in a block or at a location. However, it should be understood that even though the example of silicon is used, other semiconductor materials having highly thermally reflective surfaces may be used.

Figure 4:
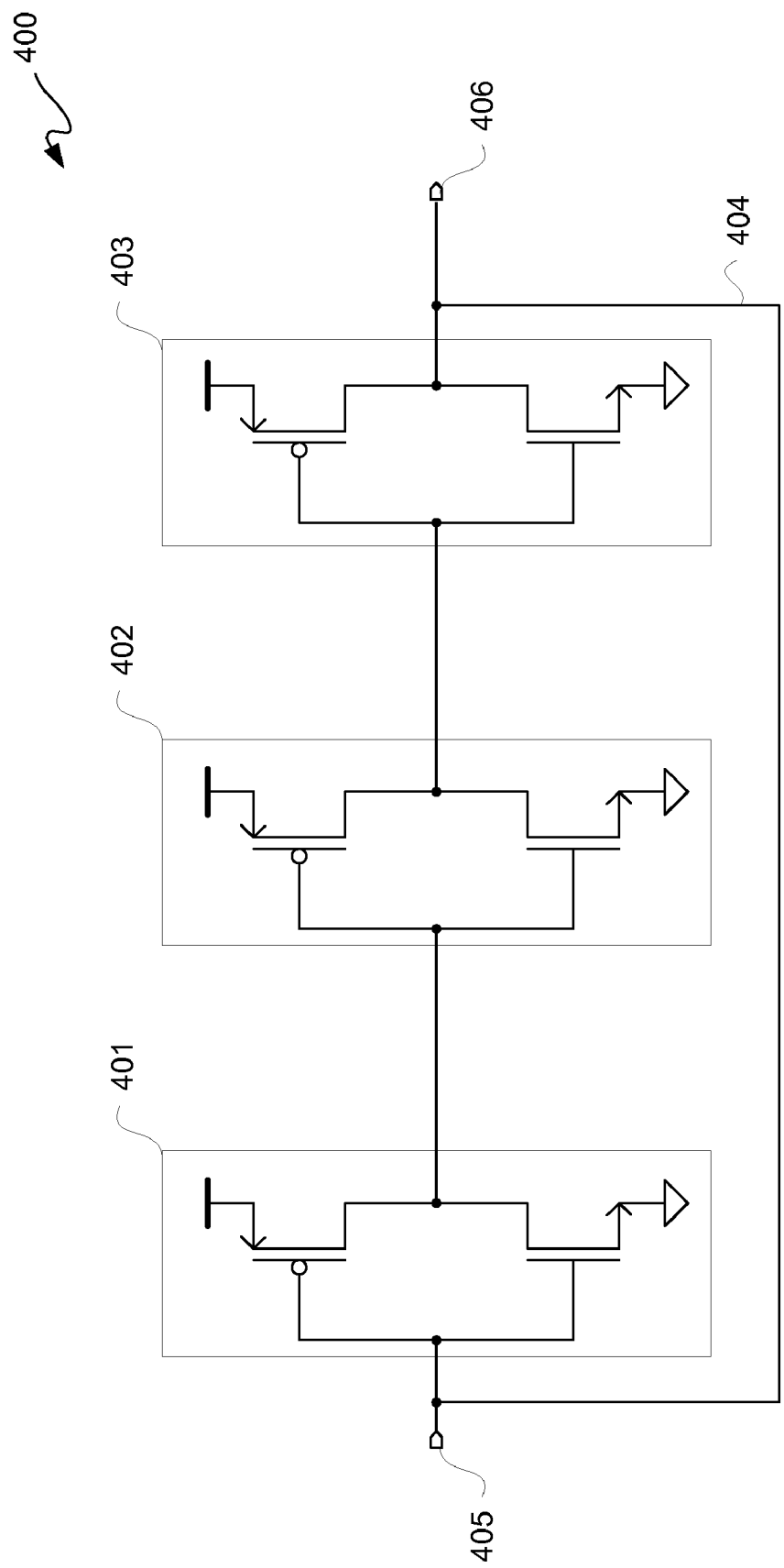
FIG. 4 is a circuit diagram depicting an exemplary embodiment of a time-loop delay circuit.

FIG. 4 is a circuit diagram depicting an exemplary embodiment of a Tilo circuit 400. Tilo circuit 400 may include inverters or buffers, such as CMOS inverters 401 through 403, coupled in a chain or series. An input 405 is provided to the chain of inverters 401 through 403 for propagation to an output 406. Output 406 is fed back as input 405. For an odd number of inverters, the logic state of an original input 405 appears as output 406 after being fed back via feedback path 404 and passed through the chain of inverters 401 through 403 again, namely at least one loop plus an additional pass through the chain of inverters. The amount of delay may be associated with propagation delay, as well as transistor switching delay for both positive logic and negative logic states, namely NMOS and PMOS transistor switching operations. In other embodiments, other types of circuits may be used for determining transistor switching speed, among other circuit performance parameters.

FIG. 5 is a perspective view depicting an exemplary embodiment of a semiconductor die portion 500, such as a portion of a semiconductor die from wafer 200 of FIG. 3. FIG. 6 is a top elevation view depicting an exemplary embodiment of a transistor 600, such as including semiconductor die portion 500 of FIG. 5. With simultaneous reference to FIGS. 5 and 6, semiconductor die portion 500 and transistor 600 are further described.

Semiconductor die portion 500 may be used in the formation of transistor 600. It should be understood that transistor 600 may include a conductive gate 502 extending across a portion of a semiconductor substrate ("substrate") 510. Substrate 510 may be of a wafer, such as wafer 200 of FIG. 2. Active areas 516 may be located on opposing sides of gate 502. A field region 511 may surround active areas 516, where such field region 511 extends under gate 502 generally at sides of active areas 516. For purposes of clarity by way of example not limitation, it shall be assumed that field region 511 is formed with shallow trench isolation ("STI") structures 501. Accordingly, trenches may be formed in substrate 510 and filled with one or more dielectric materials. For purposes of clarity by way of example not limitation, it shall be assumed that STI structures 501 are filled with an oxide, such as a high-density oxide for example; however, it should be understood that one or more other types of dielectrics may be used. Furthermore, for purposes of clarity by way of example not limitation, it shall be assumed that substrate 510 is a silicon substrate.

Active areas 516 may be formed by adding impurities or dopants to substrate 510, namely diffusion layers. In cross-section, active areas 516 are both surface areas and respective wells, such as a source region 506 and a drain region 507, which may extend to an upper surface of substrate 510. Optionally, one or two extension regions, such as lightly doped extension regions ("extension regions") 505 for example, may extend from respective active areas, such as may respectively extend from source region 506 and drain region 507 inwardly toward one another with respect to a channel region 515 of a transistor body region 517. Extension regions 505 may be located under respective sidewall spacers 503 formed along sides of gate 502 and corresponding sides of gate dielectric 504.

When heat waves or thermal spikes, as generally indicated with wavy lines 550, radiate to surfaces of semiconductor die portion 500, heat, as generally indicated by arrows 551 and 552, may be absorbed or thermally conducted into structures of semiconductor die portion 500. The amount of heat absorbed may be approximately inversely related to the amount of heat reflected from such surfaces. Thus, surfaces reflecting more heat may absorb less heat, and surfaces reflecting less heat may absorb more heat. With respect to silicon, it should be understood that a silicon surface of a silicon wafer is highly reflective, including reflective of heat. In contrast, it should be understood that a dielectric surface, such as in this example an oxide surface, may reflect substantially less heat than a corresponding silicon surface. Thus magnitude of arrow 551 may be greater than magnitude of arrow 552, where such magnitudes indicate the amount of heat absorbed or thermally conducted into field region 511 and active areas 516, respectively. Accordingly, surface temperature of field region 511 may be less than surface temperature of active areas 516 during an RTA. Furthermore, it should be understood that thermal conduction may occur from a hotter heated region to an adjacent heated region at a lower temperature, as generally indicated by wavy lines 555. Thus even though active areas 516 may be cooler than field regions 511, field regions 511 may provide heat sources for heating active areas 516.

Thermal cycling of dopants within active area 516 promotes diffusion of such dopants, such as diffusion of dopants within source region 506 and drain region 507, as well as extension regions 505. Furthermore, after dopants are implanted or diffused, or otherwise added into substrate 510, one or more thermal cycles are used to activate source and drain regions 506 and 507. In other words, thermal diffusion is used to make transistors operative. Along those lines, the degree of such activation may impact performance of a transistor. For example, if one or more of source and drain regions of a transistor are less diffuse of dopants, such transistor may transition between substantially conductive and substantially nonconductive states more slowly than a similarly situated transistor having source and/or drain regions with a more complete diffusion of dopants. Accordingly, performance among circuit blocks of an IC may vary for same circuit blocks of a semiconductor die. Such variation may be due to differences of surface temperature during semiconductor processes used to manufacture such a semiconductor die, as previously described. The following description provides useful embodiments to account for some of this variation. Such embodiments may increase performance, increase yield, and/or one or more other benefits as should be appreciated from the following description.

Figures 7, 8:
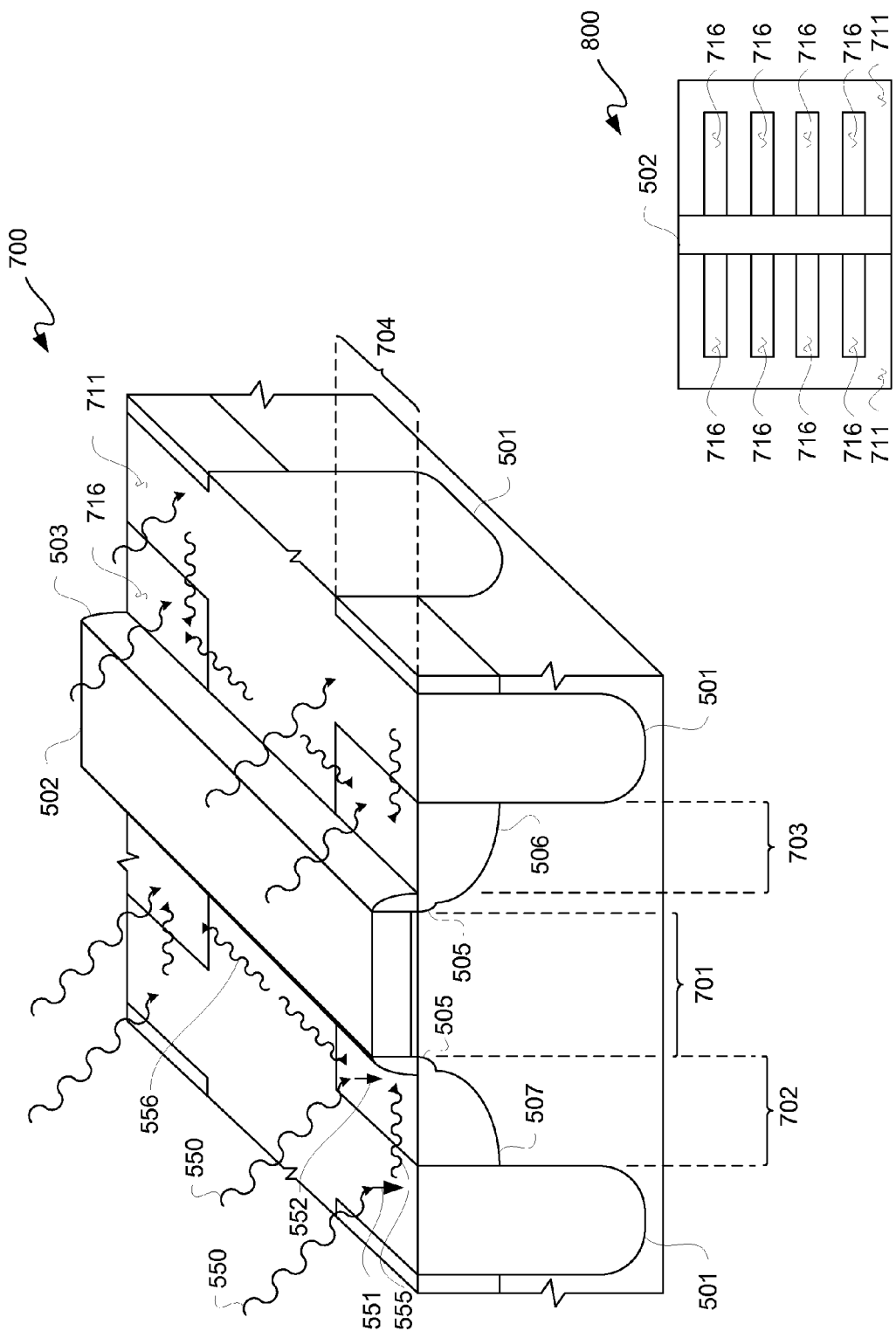
FIG. 7 is a perspective view depicting another exemplary embodiment of an IC portion, such as a portion of an IC from the semiconductor wafer depicted in FIG. 3.
FIG. 8 is a top elevation view depicting an exemplary embodiment of finger transistors, such as including the IC portion of FIG. 7.

FIG. 7 is a perspective view depicting another exemplary embodiment of a semiconductor die portion 700, such as a portion of a semiconductor die from wafer 200 depicted in FIG. 3. Some of the structures of semiconductor die portion 700 are same or similar to semiconductor die portion 500 of FIG. 5, and accordingly such description is not generally repeated for purposes of clarity. FIG. 8 is a top elevation view depicting an exemplary embodiment of finger transistors 800, such as including the semiconductor die portion 700 of FIG. 7. Finger transistors 800 are described in additional detail with simultaneous reference to FIGS. 5 through 8.

Rather than using a single relatively large transistor 600, multiple transistors, such as finger transistors 800, may be used in some applications to replace a single relatively large transistor 600. Even though four finger transistors 800 are illustratively depicted, it should be understood that at least two finger transistors may be used to replace a single transistor to reduce the amount of heat reflected off a surface as described herein. Field region 711 of finger transistors 800 has more border area with active areas 716 than field region 511 does with active areas 516. This allows for more thermal conduction, as generally indicated by wavy lines 555 and 556, to source and drain regions 506 and 507 from associated field region 711. Additionally, surface area of field region 711 may be greater than surface area of field region 511. Stated another way, for equal total surface areas, total surface area of active areas 716 is less than total surface area of active areas 516. Thus, more surface area having a lower degree of thermal reflection is provided by finger transistors 800 than a single transistor 600. Along those same lines, more surface area having a lower degree of thermal reflection is provided by finger transistors 800 than a single transistor 600 for equivalent amounts of design surface areas on an IC.

It should be understood that heat waves, generally indicated with wavy lines 550, may be blocked for direct radiation onto extension regions 505 by sidewall spacers 503. However, heating of surface areas of active areas 716 by heat waves generally indicated by wavy lines 550, provides thermal conduction to extension regions 505. Furthermore, thermal conduction from field region 711 to source and drain regions 506 and 507 associated with active areas 716 further provides thermal conduction to extension regions 505. Thus, it should be understood that for die similarly positioned on a wafer in a RTA chamber, transistors formed as finger transistors 800 may have more activation, namely more dopants being activated, than similarly positioned single transistors. Furthermore, it should be understood that such thermal conduction may extend to extension regions of such source and/or drain regions; thus, promoting activation of such extension regions. Additionally, such thermal conduction may promote lateral diffusion of such extension regions narrowing a channel region of an associated transistor.

It should be understood that channel length 701, as book ended by extension regions 505 in this exemplary embodiment or by source and drain regions 506 and 507 in the absence of extension regions 505 in another embodiment, may be affected by degree of lateral diffusion. Accordingly, active area length 702 may be affected by the amount of lateral diffusion of extension regions 505; however, reflective active area length 703 may not change by the amount of lateral fusion of extension regions 505. Furthermore, active area width 704 may be bounded by STI structures 501.

It should be appreciated that field region 711 may have junctions with active areas 716 along three areas of each source region 506 and each drain region 507. In this exemplary embodiment, an STI structure 501 borders a source region 506 or a drain region 507 along an area generally parallel with gate 502, as well as areas generally perpendicular to gate 502. This allows for thermal conduction from oxide of an STI structures 501 to a source or drain region in multiple directions, including parallel and perpendicular with respect to orientation of gate 502 as generally indicated by wavy lines 556 and 555.

Performance of one or more transistors may be enhanced by reducing diffusion pattern density, and/or in-die variation may be reduced by reducing diffusion pattern density. Again, diffusion pattern density may be proportional to surface temperature of a die of a wafer 200, and higher diffusion pattern density may cause lower surface temperature.

Generally, performance associated with speed or leakage of a die may be characterized by speed of certain selected circuits formed as part of such die, as previously described. Thus, one or more transistors may be formed to have less active area and/or to have more opportunity for thermal conduction from STI structures or other isolation structures to enhance diffusion in a diffusion layer, namely to enhance dopant diffusion in one or more wells. Substitution of finger transistors 800 for a single transistor 600 may be performed by a change to a layout during a design phase in response to a design rule. However, more generally transistors may be formed according to a design rule, as well as a lithography used. Such design rule may be associated with a diffusion layer, where a numerical value associated with such a design rule is for defining an active area on a surface of a semiconductor substrate in which such diffusion layer is formed. Limiting the maximum active area allowed on an IC for example responsive to a design rule may thus shorten the delay of the slowest Tilo associated with such active area. Thus, in response to a design rule, diffusion pattern density may for example be enhanced or optimized to improve IC performance, whether by re-sizing transistors, replacing a relatively large active area with a smaller active area, or a combination thereof. Thus, a design rule may be used to limit the maximum active area allowed for an IC in order to reduce the delay in the slowest Tilo blocks associated with a relatively higher diffusion pattern density.

Such one or more transistors formed in accordance with such a design rule may be part of a timing loop delay circuit. Additionally, it should be understood that some circuit blocks may be more susceptible to thermal reflection than other circuit blocks due to having a larger degree of active area, and thus thermal reflection. For purposes of clarity by way of example and not limitation, circuit blocks of FPGA 100 of FIG. 1, such as IOBs 104, CLBs 102, and transceivers, whether MGTs 101 or other types of transceivers, may have more active area than other types of circuit blocks, such as logic or signal processing blocks, for example DSP tiles 106, and memory blocks, for example BRAMs 103. Accordingly, design rules may be different for different types of circuit blocks. Furthermore, even though the example of some circuit blocks of an FPGA is used, it should be appreciated that these and/or other types of circuit blocks of an FPGA or other type of semiconductor die may be used.

Figure 9:
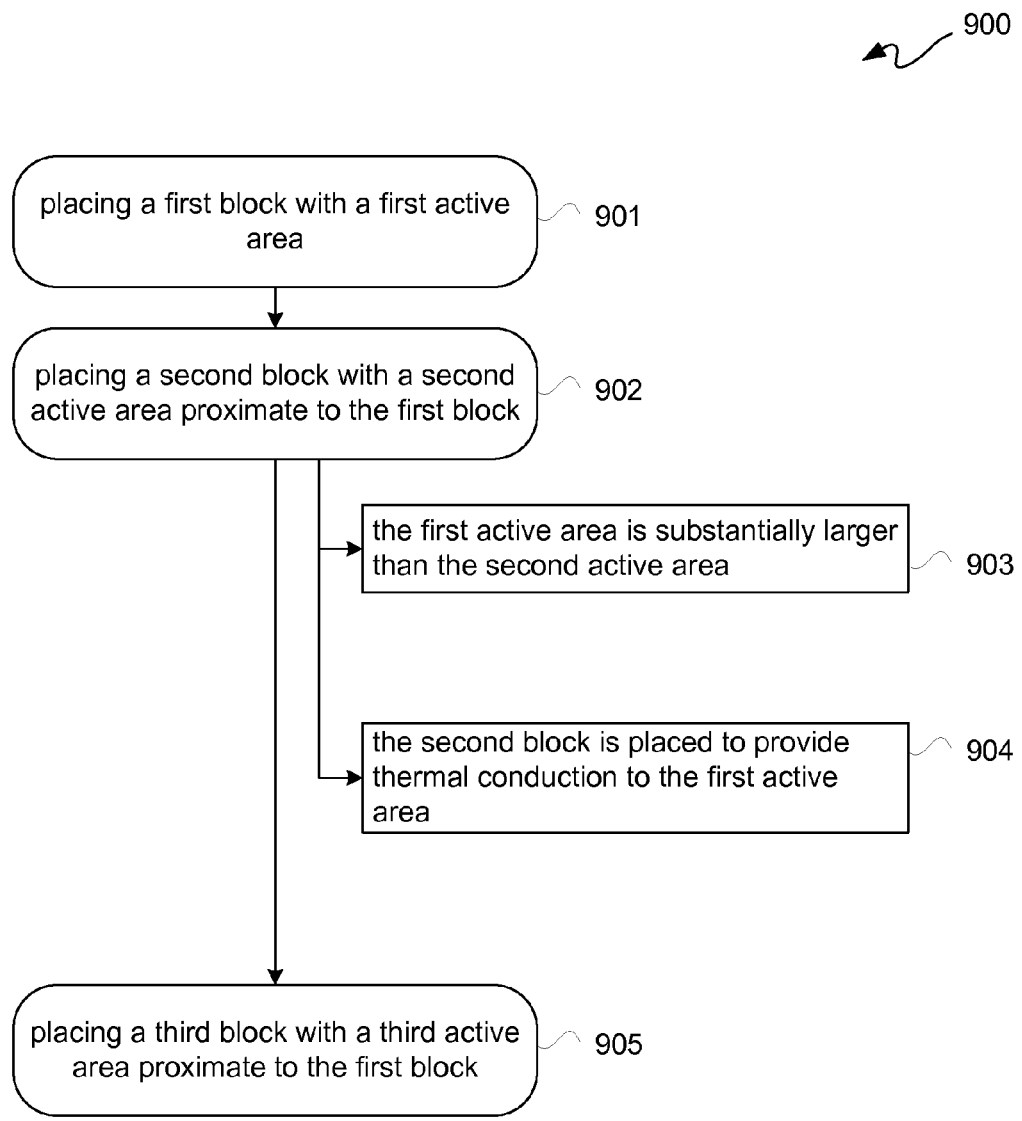
FIG. 9 is a flow diagram depicting an exemplary embodiment of a floor planning process flow for an IC.

FIG. 9 is a flow diagram depicting an exemplary embodiment of a floor planning process flow 900 for a semiconductor die, such as a semiconductor die of a reticle field 301 of FIG. 3 for example. Floor planning process flow 900 may be implemented using a program general-purpose computer, as described below in additional detail.

At 901, a first block with a first active area is located or identified. Such first block may be a circuit block of FPGA 100 or other type of semiconductor die. At 902, a second block with a second active area is placed proximate to the first block, such as the first block and the second block may be side-by-side next to one another. Again, such second block may be a circuit block of FPGA 100 or other type of semiconductor die. It should be understood that thermal conduction may pass through intervening circuitry, such as busing or interconnect circuitry, between adjacent blocks, and thus such first and second blocks may be considered side-by-side next to one another, even though not immediately adjacent, provided a sufficient amount of thermal conduction passes from one block to another for enhancing diffusion in the block receiving the additional thermal energy.

Rather than or in addition to addressing surface temperature at the transistor level using a design rule, surface temperature may be addressed on a circuit block by circuit block basis. Along those lines, a condition 903 of such placement of such first and second blocks may be that the first active area is substantially larger than the second active area. Furthermore, a condition 904 of placement of such a second block may be that the second block is positioned to provide thermal conduction to the first active area to enhance diffusion in the first active area during a semiconductor process operation involving a thermal cycle. Implicit within condition 904 may be that the thermal cycle is sufficient to promote dopant diffusion in the second active area and to provide thermal conduction sufficient to enhance dopant diffusion in the first active area. Furthermore, this means that the second block effectively has a higher surface temperature during such thermal cycle than the first block, which may be for reasons as previously described. Thus heat is transferred by thermal conduction from a hotter second block to a cooler first block, such as to enhance activation of dopants in at least one region of the first block.

Optionally, in order to further enhance dopant diffusion in the first active area, at 905 a third block with a third active area, which may be another instance of the second block, may be placed proximate to the first block. The third active area is substantially less than the first active area, such that the third block provides thermal conduction to the first active area to enhance diffusion in the first active area during a semiconductor process operation involving a thermal cycle. Such placement may effectively sandwich the first block between the second block and the third block.

Various circuit blocks of a semiconductor die may be positioned relative to one another to effectively enhance diffusion during a thermal cycle of a semiconductor process operation, where surface temperature is affected by the amount of exposed active area on a surface. In other words, the amount of thermal reflectivity of a circuit block may be used as an indicator for determining how to position such circuit block relative to one or more other circuit blocks.

Figure 10:
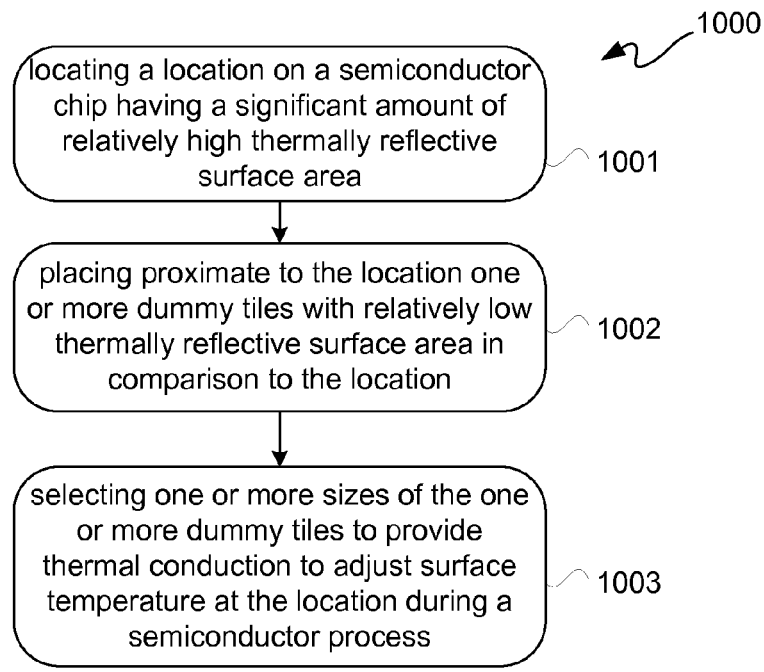
FIG. 10 is a flow diagram depicting an exemplary embodiment of a dummy tiling process flow for controlling the surface temperature of an IC.

FIG. 10 is a flow diagram depicting an exemplary embodiment of a dummy tiling process flow 1000 for controlling die surface temperature. Process flow 1000 may be used separately or added to process flow 900 for floor planning a semiconductor die. However, for purposes of clarity and not limitation, process flow 1000 is described as being independent of process flow 900.

It should be appreciated that some areas on a die because of their diffusion pattern density will have higher or lower surface temperatures during a semiconductor process operation involving a thermal cycle. With reference to FIG. 9, circuit blocks were floor planned according to their relative amount of exposed active area surface area. However, blocks or tiles other than functional circuit blocks may be used. For example, dummy tiles may be placed for adjusting surface temperature as described below in additional detail.

At 1001, a location on a semiconductor die may be identified having a significant amount of a relatively high thermally reflective surface area. For example, the location identified at 1001 may be a die seal area or a die scribe area. At 1002, one or more dummy tiles may be placed proximate to such location. Such one or more dummy tiles may have relatively low thermally reflective surface area in comparison to the location.

At 1003, one or more sizes of the one or more dummy tiles placed at 1002 may be selected to provide thermal conduction. Such thermal conduction may be to adjust the die surface temperature at the location during a thermal cycle of a semiconductor process operation. Again, such a thermal cycle of such a semiconductor operation may be sufficient for promoting dopant diffusion in an active area. Such one or more dummy tiles may be scaled down in size responsive to a design rule. Such scaling may be in order to place more of such dummy tiles proximate to the location.

Adjustment of die surface temperature may be to adjust a circuit parameter associated with circuitry proximate to such a location by enhancing dopant diffusion in such defined amount of active area. For example, at least one parameter may be adjusted by use of one or more dummy tiles as described herein, where such parameter may be transistor threshold voltage, overlap resistance, overlap capacitance, time loop delay, and/or other circuit operational parameter.

Figure 11:
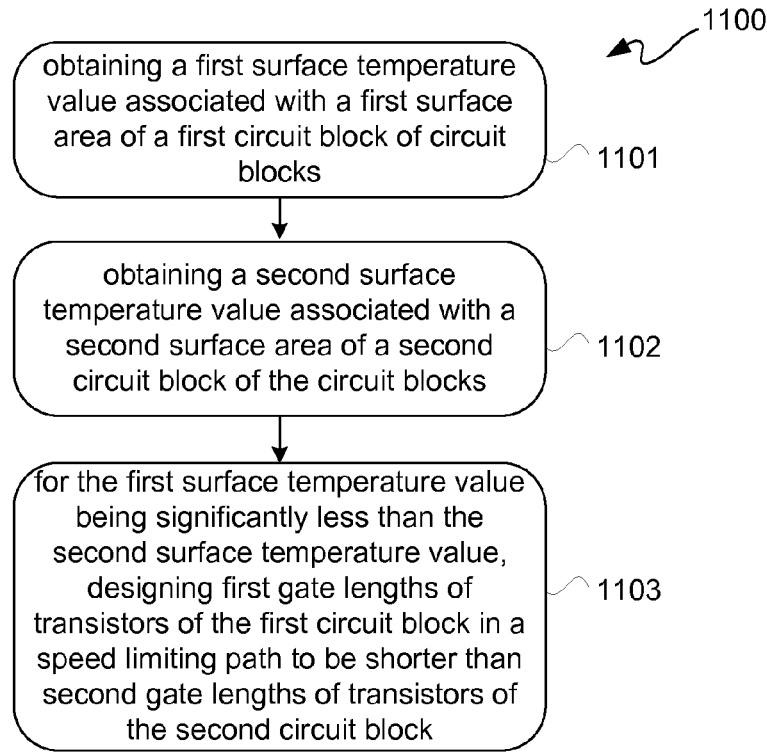
FIG. 11 is a flow diagram depicting an exemplary embodiment of a gate length adjustment process flow for equalizing performance among circuit blocks of an IC.

FIG. 11 is a flow diagram depicting an exemplary embodiment of a gate length adjustment process flow 1100 for equalizing performance among circuit blocks of a semiconductor die. At 1101, a first temperature value associated with a first surface area of a first circuit block of such circuit blocks is obtained. Such first temperature value may be associated with a surface temperature of the first circuit block during a thermal cycle of a semiconductor process operation. Such first surface area may be associated with an active area of the first circuit block.

At 1102, a second temperature value associated with a second surface area of a second circuit block of the circuit blocks is obtained. Such second temperature value may be associated with a surface temperature of second circuit block during such thermal cycle. Such a second surface area may be associated with an active area of the second circuit block. It should be understood that the active area of the first circuit block is significantly larger, and thus reflects more heat, than the active area of the second circuit block.

At 1103, for the first value being significantly less than the second value, first gate lengths of transistors of the first circuit block are designed to be shorter than second gate lengths of transistors of the second circuit block. Accordingly, a gate length of a transistor of the transistors of the first circuit block may be designed to be formed to be approximately 2 to 6 percent shorter than a gate length of an equivalent transistor of the transistors of the second circuit block. The first circuit block may be selected from a group including a transceiver block, such as an MGT 101 for example, and an IOB 104. The second circuit block may be a programmable resource block, such as a CLB 102 for example.

For purposes of clarity by way of example not limitation, suppose MGTs 101 or IOBs 104 neighbor CLBs 102. Further suppose that CLBs 102 immediately adjacent or next to such MGT 101 or IOBs 104 have transistors in a Tilo path associated with setting speed of a semiconductor die. This speed limiting path is sometimes referred to as a "critical path" of a semiconductor die. Because MGTs 101 or IOBs 104 have a relatively high diffusion pattern density, such circuit blocks may generally have lower surface temperatures during thermal cycling of a semiconductor process operation. Accordingly, to compensate for the impact of such lower surface temperatures, gate lengths may be shortened in MGTs 101 or IOBs 104 neighboring CLBs 102. By shortening gate length, transistors with shortened gate lengths may switch faster than if such gate lengths were not shortened.

For a surface temperature of a circuit block being lower than a surface temperature of another circuit block, dopant diffusion may be less predominant in the circuit block with the lower surface temperature. If transistors in both of such circuit blocks were equally formed, then the transistors in the circuit block with the cooler surface temperature reached during thermal cycling of a semiconductor process operation may switch more slowly during operation than their corresponding transistors in a circuit block with a higher surface temperature. To compensate for this difference in speed of operation, transistor gate lengths may be shortened in the circuit block with the lower surface temperature. Accordingly, performance of transistors may be equalized among circuit blocks.

Furthermore, speed characterization of a semiconductor die may be enhanced. For example, a manufacturer of semiconductor die may more accurately identify locations having slowest in-die Tilo times due to RTA and STI density effects as describe elsewhere herein. If such a die has programmable routing resources, or if routing is mask layer programmable, such programmable routing resources may be programmed or mask layer programming of routing may be used to increase an overall Tilo value by avoiding or otherwise mitigating the effects of such slow locations. Optionally, threshold voltage ("Vt") of transistors in such slow locations may have a special Vt adjustment implant to lower such threshold voltages in such slow locations. Thus, slow transistors may be made to switch faster by lowering their Vt. Accordingly, a cool circuit block may have transistors with lower Vts than comparable transistors in a hot circuit block.

Even though the above description has been in terms of FPGA circuit blocks, design, for floor planning, it should be understood that other ICs may be used, including memory devices, analog products, and logic devices. It should further be appreciated that reductions in speed variation of transistors may be effectuated in FPGAs and such other ICs.

Figure 12:
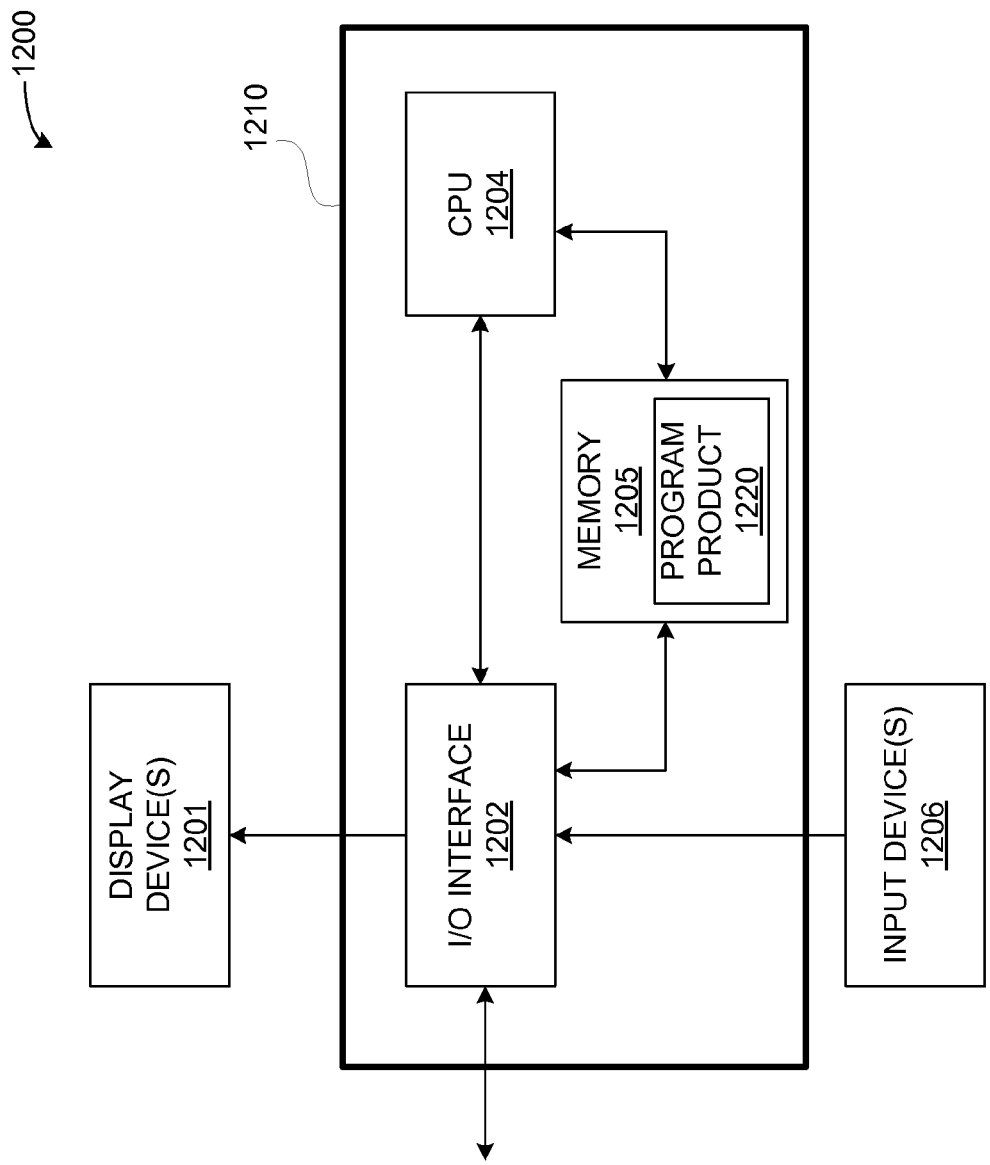
FIG. 12 is a block diagram depicting an exemplary embodiment of a computer system including a program product.

FIG. 12 is a block diagram depicting an exemplary embodiment of a computer system 1200. Computer system 1200 may include a programmed computer 1210 coupled to one or more display devices 1201, such as Cathode Ray Tube ("CRT") displays, plasma displays, Liquid Crystal Displays ("LCD"), projectors and to one or more input devices 1206, such as a keyboard and a cursor pointing device. Other known configurations of a computer system may be used.

Programmed computer 1210 may be programmed with a known operating system, which may be Mac OS, Java Virtual Machine, Linux, Solaris, Unix, or a Windows operating system, among other known platforms. Programmed computer 1210 includes a central processing unit (CPU) 1204, memory 1205, and an input/output ("I/O") interface 1202. CPU 1204 may be a type of microprocessor known in the art, such as available from IBM, Intel, ARM, and Advanced Micro Devices for example. Support circuits (not shown) may include cache, power supplies, clock circuits, data registers, and the like. Memory 1205 may be directly coupled to CPU 1204 or coupled through I/O interface 1202. At least a portion of an operating system may be disposed in memory 1205. Memory 1205 may include one or more of the following: random access memory, read only memory, magneto-resistive read/write memory, optical read/write memory, cache memory, magnetic read/write memory, and the like, as well as non-transitory signal-bearing media as described below.

I/O interface 1202 may include chip set ICs, graphics processors, and daughter cards, among other known circuits. An example of a daughter card may include a network interface card ("NIC"), a display interface card, a modem card, and a Universal Serial Bus ("USB") interface card, among other known circuits. Thus, I/O interface 1202 may be coupled to a conventional keyboard, network, mouse, display printer, and interface circuitry adapted to receive and transmit data, such as data files and the like. Programmed computer 1210 may be coupled to a number of client computers, server computers, or any combination thereof via a conventional network infrastructure, such as a company's Intranet and/or the Internet, for example, allowing distributed use for interface generation.

A computer aided design program may be recorded in a non-transitory machine readable medium. For example, memory 1205 may store all or portions of one or more programs or data to implement processes in accordance with one or more embodiments hereof to provide any one or more embodiments of processes hereof, including a computer aided design program that includes one or more of process flows 900, 1000, 1100, (collectively and singly herein "program product") 1220. When executed, such as on a general-purpose computer converted to a special-purpose computer when loaded with program product 1220, program product 1220 performs one or more operations of one or more of process flows 900, 1000, and/or 1100. Additionally, those skilled in the art will appreciate that one or more embodiments hereof may be implemented in hardware, software, or a combination of hardware and software. Such implementations may include a number of processors or processor cores independently executing various programs and dedicated hardware or programmable hardware.

One or more program(s) of the program product 1220, as well as documents thereof, may define functions of embodiments hereof and can be contained on a variety of non-transitory signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or hard-disk drive or read/writable CD or read/writable DVD). The above embodiments specifically include information downloaded from the Internet and other networks. Such non-transitory signal-bearing media, when carrying computer-readable instructions that direct functions hereof, represent embodiments hereof.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof. Claims listing steps do not imply any order of the steps. Trademarks are the property of their respective owners.

What is claimed is:

1. A method for floor planning an integrated circuit, comprising:
    placing a first block with a first active area;
    placing a second block with a second active area proximate to the first block in response to the first active area being substantially larger than the second active area;
    wherein the first block and the second block are circuit blocks of the integrated circuit; and
    wherein the second block is placed to provide thermal conduction to at least one region of the first block associated with the first active area to increase temperature thereof during a semiconductor process in order to enhance activation of dopants in the at least one region of the first block.

2. The method according to claim 1, wherein the first block is selected from a group consisting of a transceiver block, an input/output block, and a configurable logic block.

3. The method according to claim 2, wherein the second block is selected from a group consisting of a random access memory block and a digital signal processing block.

4. The method according to claim 1, further comprising:
    determining in-chip time loop speed using circuitry of the first block; and
    determining a speed of the integrated circuit based on the determined in-chip time loop speed.

5. The method according to claim 1, further comprising:
    placing a third block with a third active area proximate to the first block;
    wherein the first block is placed between the second block and the third block; and
    wherein the third block is placed to provide thermal conduction to the at least one region associated with the first active area to further increase the temperature thereof during the semiconductor process in order to further enhance the activation of dopants in the at least one region of the first block.

6. The method according to claim 1, further comprising:
    locating a location on the integrated circuit having a significant amount of relatively high thermally reflective surface area;

placing proximate to the location one or more dummy tiles with relatively low thermally reflective surface area in comparison to the location; and selecting one or more sizes of the one or more dummy tiles to provide thermal conduction to adjust surface temperature at the location during the semiconductor process.

7. The method according to claim 6, wherein the location is selected from a group consisting of die seal area and a die scribe area.

8. The method according to claim 6, wherein the one or more dummy tiles are scaled down in size responsive to a design rule in order to place more of the one or more dummy tiles proximate to the location.

9. A system for floor planning an integrated circuit (IC), comprising:
    a processor;
    a memory coupled to the processor, wherein the memory is configured with a program that when executed by the processor, causes the processor to perform operations including:
        placing a first circuit block of the IC, the first circuit block having a first active area;
        placing a second circuit block of the IC proximate to the first block in response to the first active area being substantially larger than second active area of the second circuit block;
        wherein the second circuit block is placed to provide thermal conduction to a region of the first circuit block to increase temperature of the region during a semiconductor process and enhance activation of dopants in the region.

10. The system of claim 9, wherein the first circuit block is selected from a group consisting of a transceiver block, an input/output block, and a configurable logic block.

11. The system of claim 10, wherein the second circuit block is selected from a group consisting of a random access memory block and a digital signal processing block.

12. The system of claim 9, further comprising:
    determining in-chip time loop speed using circuitry of the first circuit block; and
    determining a speed of the integrated circuit based on the determined in-chip time loop speed.

13. The system of claim 9, further comprising:
    placing a third circuit block of the IC proximate to the first circuit block, the third circuit block having a third active area;
    wherein the first circuit block is placed between the second circuit block and the third circuit block; and
    wherein the third circuit block is placed to provide thermal conduction to the region of the first circuit block to further increase the temperature of the region during the semiconductor process in order to further enhance the activation of dopants in the region.

14. The system of claim 9, further comprising:
    locating a location on the integrated circuit having a significant amount of relatively high thermally reflective surface area;
    placing proximate to the location one or more dummy tiles with relatively low thermally reflective surface area in comparison to the location; and
    selecting one or more sizes of the one or more dummy tiles to provide thermal conduction to adjust surface temperature at the location during the semiconductor process.

15. The system of claim 14, wherein the location is selected from a group consisting of die seal area and a die scribe area.

16. The system of claim 14, wherein the one or more dummy tiles are scaled down in size responsive to a design rule in order to place more of the one or more dummy tiles proximate to the location.

* * * * *